(12) United States Patent
Tsironis (10) Patent No.: US 11,879,921 B1
(45) Date of Patent: Jan. 23, 2024

(54) SIMPLE COAXIAL LOAD PULL TUNER

(71) Applicant: Christos Tsironis, St-Laurent (CA)

(72) Inventor: Christos Tsironis, Kirkland (CA)

( * ) Notice: Subject to any disclaimer, the term of this patent is extended or adjusted under 35 U.S.C. 154(b) by 0 days.

(21) Appl. No.: 17/980,051

(22) Filed: Nov. 3, 2022

(51) Int. Cl.
*G01R 29/08* (2006.01)

(52) U.S. Cl.
CPC ............... *G01R 29/0871* (2013.01)

(58) Field of Classification Search
CPC .................................. G01R 29/0871
See application file for complete search history.

(56) References Cited

U.S. PATENT DOCUMENTS

| | | | |
|---|---|---|---|
| 5,910,754 A | 6/1999 | Simpson et al. | |
| 9,625,556 B1 | 4/2017 | Tsironis | |
| 9,666,928 B1 | 5/2017 | Tsironis | |
| 11,327,101 B1 * | 5/2022 | Tsironis | G01R 27/32 |
| 11,506,708 B1 * | 11/2022 | Tsironis | H03J 1/06 |
| 11,742,833 B1 * | 8/2023 | Tsironis | G01K 5/48 |
| | | | 334/39 |

OTHER PUBLICATIONS

"Load Pull Measurements" [online], Wikipedia [retrieved on Nov. 18, 2016] Retrieved from Internet <URL:http://en.wikipedia.org/wiki/Load_pull>.
"Computer Controlled Microwave Tuner", Product Note 41, Focus Microwaves, Jan. 1998.
"Automatic Load Contour Mapping for Microwave Power Transistors" IEEE transactions on MTT, vol. 22, No. 12, Dec. 1974, pp. 1146-1152.
"Two-port Gain and Stability", Niknejad, University of California, Berkley, p. 15 of 32.
"Linear Actuator" [online], Wikipedia [retrieved on Apr. 25, 2020] Retrieved from Internet <URL: https://en.wikipedia.org/wiki/Linear_actuator>.
"A Computer-Controlled Microwave Tuner for Automated Load Pull", Sechi F, et al., RCA Review, vol. 44, Dec. 1983, pp. 566-583, figure 5.
"Lecture 20: Transmission (ABCD) Matrix" [online], EE 481/581— Microwave Engineering, Course Syllabus [retrieved on Jul. 13, 2015] Retrieved from Internet <URL: http://whites.sdsmt.edu/classes/ee481/notes/481Lecture20>.
"What is a Vector Network Analyzer and how does it work?" [online], Tektronix [retrieved on Jun. 10, 2020] Retrieved from Internet < https://www.tek.com/document/primer/what-vector-network-analyzer-and-how-does-it-work>.

* cited by examiner

*Primary Examiner* — Jermele M Hollington
*Assistant Examiner* — Zannatul Ferdous (57) ABSTRACT

Coaxial load pull tuners use one horizontally-only moving metallic reflective probe inserted in the slabline at fixed penetration and an adjustable RF energy absorbing eccentrically into the slabline rotated disc. The tuner does not use high precision vertical axes. The remotely adjustable attenuator is inserted adjacent to the test port and mitigates spurious high reflection. Calibration procedures using de-embedding or adapter removal techniques allow high resolution full tuner characterization in a few minutes.

8 Claims, 14 Drawing Sheets

SIMPLE COAXIAL LOAD PULL TUNER

PRIORITY CLAIM

Not Applicable

CROSS-REFERENCE TO RELATED ARTICLES

1. "Load Pull Measurements" [online], Wikipedia [retrieved on Nov. 18, 2016] Retrieved from Internet <URL:http://en.wikipedia.org/wiki/Load_pull>.
2. "Computer Controlled Microwave Tuner—CCMT", Product Note 41, Focus Microwaves January 1998.
3. Simpson et al. U.S. Pat. No. 5,910,754, "Reduced Height Waveguide Tuner for Impedance Matching", FIG. 8.
4. "Automatic Load Contour Mapping for Microwave Power Transistors" IEEE transactions on MTT, Vol.-22, No 12, December 1974, pp. 1146-1152.
5. Tsironis C., U.S. Pat. No. 9,625,556, "Method for Calibration and Tuning with Impedance Tuners".
6. "Two-port Gain and Stability", Niknejad, University of California, Berkley, page 15 of 32.
7. Linear Actuator [online], Wikipedia [retrieved on 04/25/2020] Retrieved from Internet <URL: https://en.wikipedia.org/wiki/Linear actuator>
8. "A Computer-Controlled Microwave Tuner for Automated Load Pull", Sechi F, et al., RCA Review, Vol 44, December 1983, pp. 566-583, FIG. 5.
9. "Lecture 20: Transmission (ABCD) Matrix" [online], EE 481/581—Microwave Engineering, Course Syllabus [retrieved on Jul. 13, 2015] Retrieved from Internet <URL: http://whites sdsmt.edu/classes/ee481/notes/481Lecture20>
10. "What is a Vector Network Analyzer and how does it work?" [online], Tektronix [retrieved on 06/10/2020] Retrieved from Internet <URL: https://www.tek.com/document/primer/what-vector-network-analyzer-and-how-does-it-work>.
11. Tsironis C., U.S. Pat. No. 9,666,928, "High power slide screw tuners", figure

BACKGROUND OF THE INVENTION

This invention relates to RF load and source pull testing of medium and high-power RF transistors and amplifiers using remote controlled electro-mechanical impedance tuners.

Figure 1:
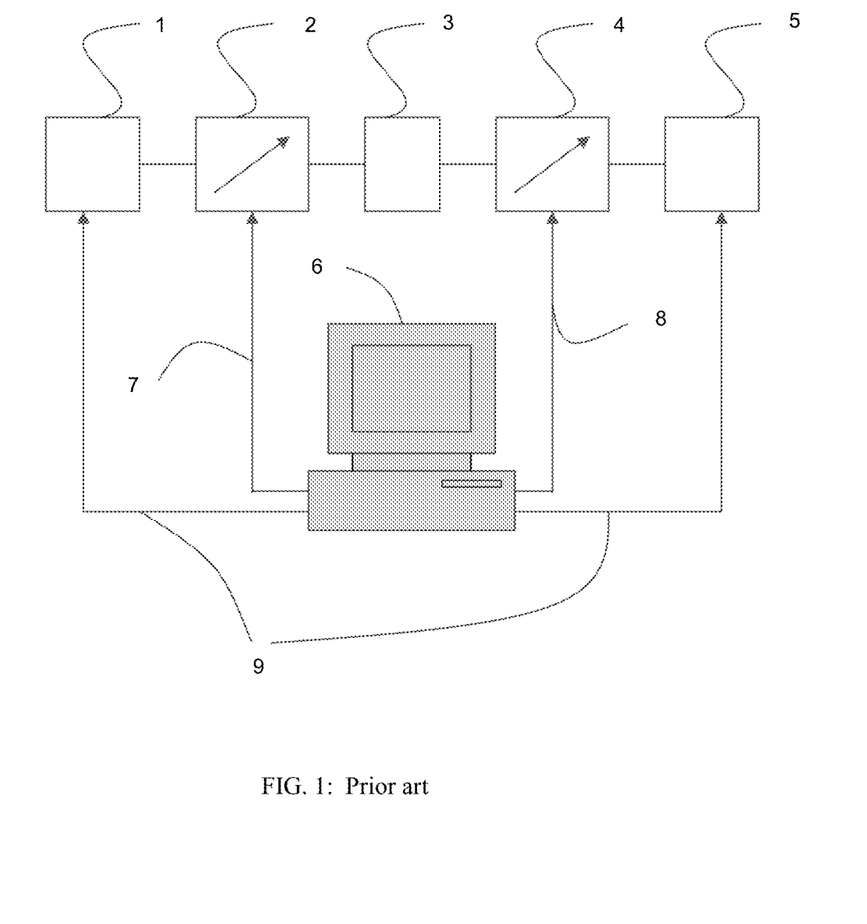
FIG. 1 depicts prior art: a typical automated load pull test system.

A popular method for testing and characterizing such microwave components (transistors) in the non-linear region of operation is "load pull" (see ref 1). Load pull is a RF device measurement technique employing microwave impedance tuners and other microwave test equipment as shown in FIG. 1. The microwave tuners 2, 4 (see ref. 2) are used in order to manipulate the microwave impedance conditions under which the Device Under Test (DUT, or transistor, 3) is tested; the test signal is provided by a signal source 1 and the out-coming power is measured by a power meter 5; the whole is controlled by a PC controller 6, which comprises electronic interface to communicate with the instruments 1, 5 and the tuners 2, 4 using digital control and communication cables 7, 8 and 9.

DESCRIPTION OF PRIOR ART

Figure 2:
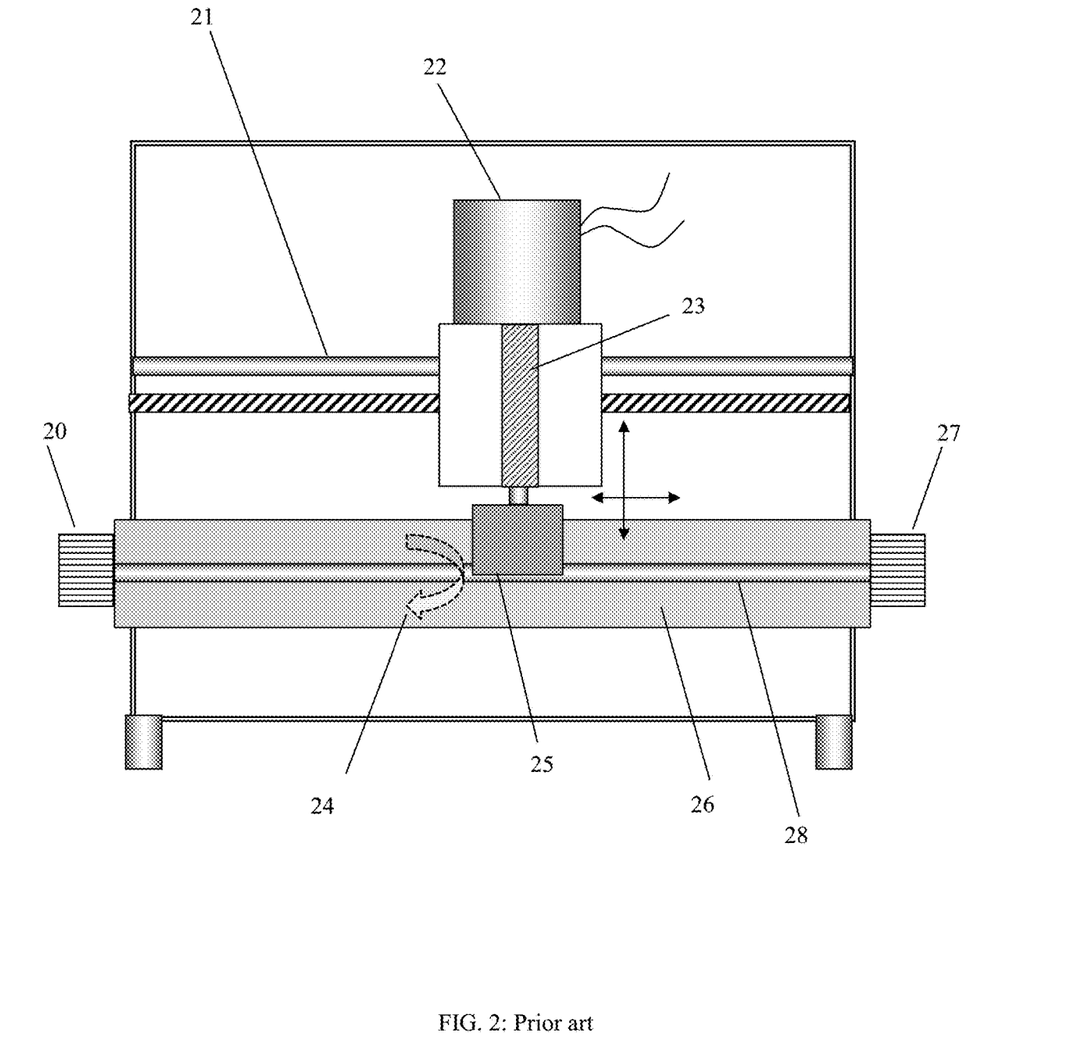
FIG. 2 depicts prior art: front view of a single carriage-single probe slide screw tuner.

Slide screw impedance tuners comprise, in general, a slotted low loss transmission line 26 (slabline), FIG. 2, between a test port 20 and an idle port 27 and at least one conductive (preferably metallic) tuning element (metallic reflective tuning probe, 25); the probe 25 is attached on a complex adjustable high precision vertical axis 23 (see ref. 3) and is inserted into the slabline 26, controlled by stepper motor 22, approaching very closely and with extreme accuracy and repeatability the center conductor 28 and is guided 21 along the axis of the slabline; this movement of the metallic reflective tuning probe creates a controllable variable reactance (reflection 24), allowing the synthesis of various impedances (or reflection factors) covering large parts, up to the quasi totality, of the Smith chart (the polar impedance mapping display showing the normalized reflection factor area). The relation between reflection factor $\Gamma$ and impedance Z is given by $\Gamma=(Z-Zo)/(Z+Zo)$, where $Z=R+jX$ and Zo is the characteristic impedance. A typical value used for Zo is 50 $\Omega$.

Figure 3:
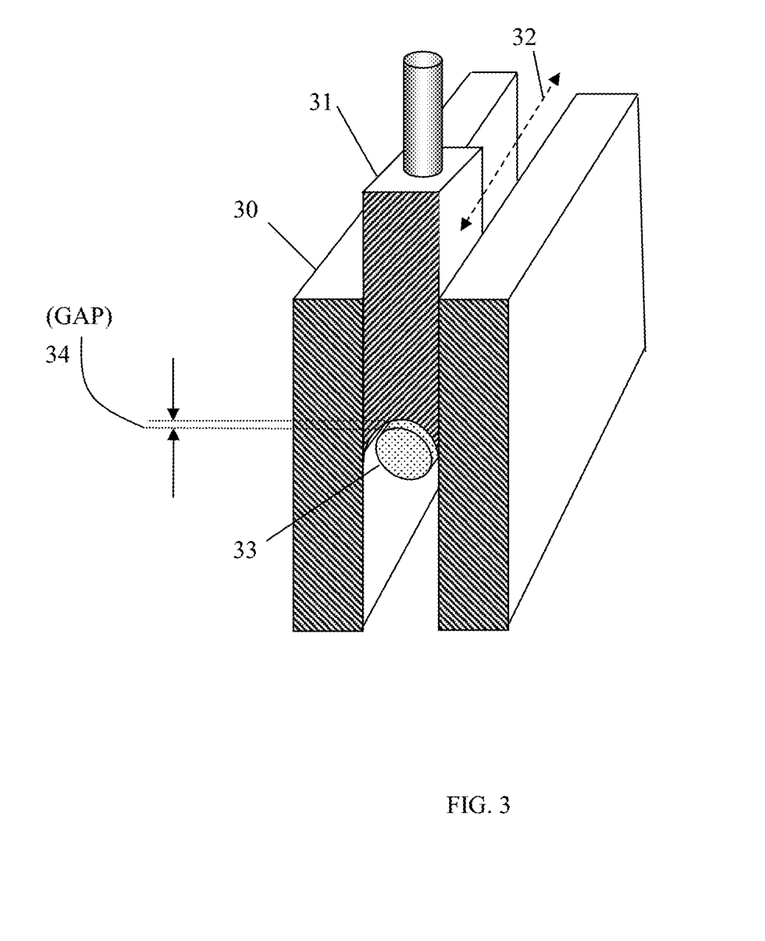
FIG. 3 depicts a perspective view of a capacitively coupled, horizontally only movable parallelepiped metallic reflective tuning probe (slug) and the relevant dimensions and parameters of the operation.

Parallelepiped metallic reflective tuning probes (slugs) 31, FIG. 3, must be positioned in the slabline 30 within a couple of dozens of micrometers 34 from the center conductor 33 to create acceptable high reflection (high tuning range); this creates electrical sparking risk at high power. Also, it creates extreme demand on the precision of the vertical axis mechanism (see ref 3 and 11). The need for a sophisticated vertical axis is canceled if the tuning probe moves only horizontally 32. This invention offers this as an alternative to the requirement for the extremely precise vertical axis mechanism.

BRIEF SUMMARY OF THE INVENTION

The invention claims a load pull tuner system using a new, mechanically simpler, tuner type. The structure is different from prior art slide screw tuners (ref 2, 4 and 9 and FIG. 2), because it uses horizontally-only high-speed tuning probe movement (ref. 4 and 9) but, in addition it uses (a) an in series adjustable attenuator to mitigate the disadvantageous residual spurious reflection of the tuner in ref 4 and 9 and (b) a new fast de-embedding calibration method (see ref 5), which in ref. 8 was substituted by an inaccurate numerical model. Once the tuner is properly calibrated, prior art impedance synthesis (tuning) methods are applicable (see ref. 5).

The tuner itself uses a slotted, low loss, coaxial airline, (FIGS. 3, 4 and 8), in order to allow simple manufacturing and alignment. The major advantage of the prior art slide screw tuner of FIG. 2, compared with Cusack's dual probe tuner of ref. 4 and 9, is that the tuner of this invention has a wideband 50Ω neutral state whereas this is impossible to achieve with the dual probe tuner of ref. 4 and 9, since the toroid probes, or any fixed penetration probes, are always engaged and cannot be withdrawn. The dual probe tuner of ref. 4 and 9 has no neutral state. 50Ω, instead, is an impedance to be tuned to for each individual frequency. This is a handicap when connecting such tuners to any potentially unstable (see ref 6) active DUT (transistor), which may oscillate spontaneously at any frequency where random high reflection factors (see FIG. 5) are presented and the oscillation conditions are satisfied. The carriage attached to the metallic reflective tuning probe can be controlled using high-speed electric stepper actuators (see ref. 7) thus eliminating also additional control gear beyond a simple ACME lead screw 83 and motor 85. Last, but not least, the tuning mechanism, liberated from cumbersome and expensive high-resolution vertical probe control and movement delays, benefits also from inherent lower tuning error sensitivity to vertical mechanical probe positioning tolerances close to or very high VSWR (see ref. 11).

To eliminate this remaining handicap of prior art, in addition to the horizontally movable probe the new tuner also includes a vertically-only adjustable RF energy-absorbing device 82 inserted in the slabline 86 close to the test port 80 and before the metallic reflective tuning probe 89. This absorbing device has fixed horizontal position and is inserted between the states of full withdrawal and full insertion into the slabline cavity 48. At full withdrawal the RF energy-absorbing device (FIG. 4) has no effect on the transmission behavior of the tuner and, at maximum insertion, it creates insertion loss and reduces the wideband reflection of the metallic reflective tuning probe (FIG. 5); the RF energy-absorbing device is controlled remotely using a stepper motor 40, 81. Control of the proximity 47 is made using the eccentric rotation 43 of the disc-formed absorbing probe 41 around the motor axis 42.

The effect of this additional absorbing device is to limit the always present undesired peaks in reflection factor 50 above a certain limit 51, over a large frequency bandwidth (FIG. 5), created by the always engaged metallic reflective tuning probe 89 at any horizontal position. This attenuator eliminates the risk of undesired spurious oscillations (see ref. 6). The built-in adjustability of the created attenuation allows searching for an optimum tuning compromise between spurious oscillations and maximum reflection factor. Any other solution would require adjustable absorbing band-pass filters, a narrow-band cumbersome endeavor.

BRIEF DESCRIPTION OF THE SEVERAL VIEWS OF THE DRAWINGS

The invention and its mode of operation will be more clearly understood from the following detailed description when read with the appended drawings in which:

FIGS. 11A through 11B depict two operation states of the tuner.

DETAILED DESCRIPTION OF THE INVENTION

Figure 12:
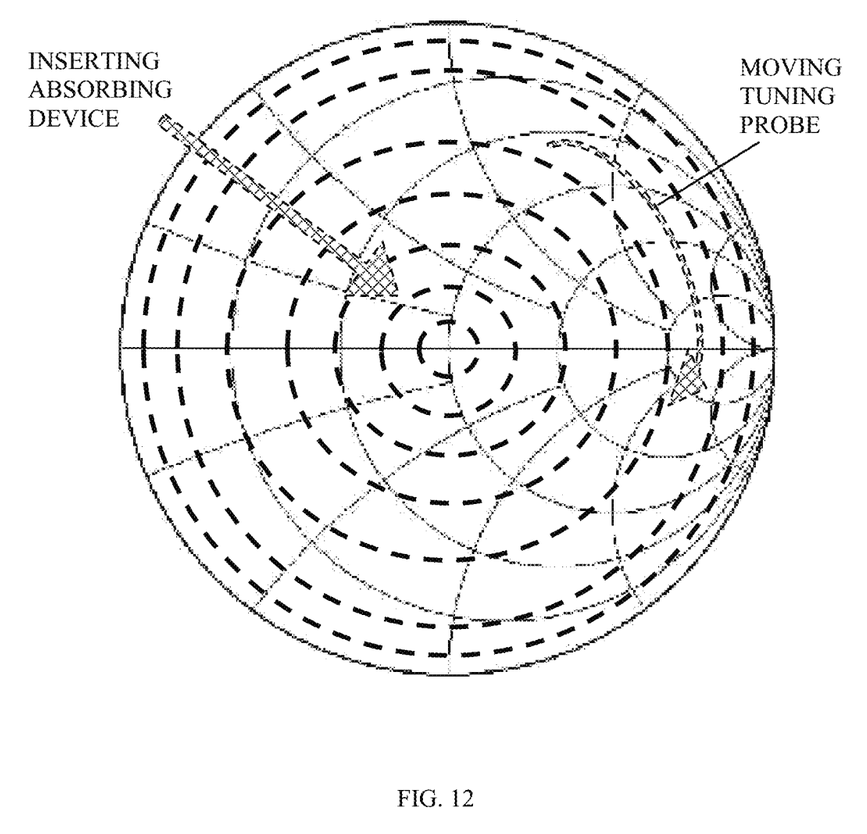
FIG. 12 depicts the effect of increasing attenuation and horizontally moving the tuning probe on overall reflection factor.
Figure 13:
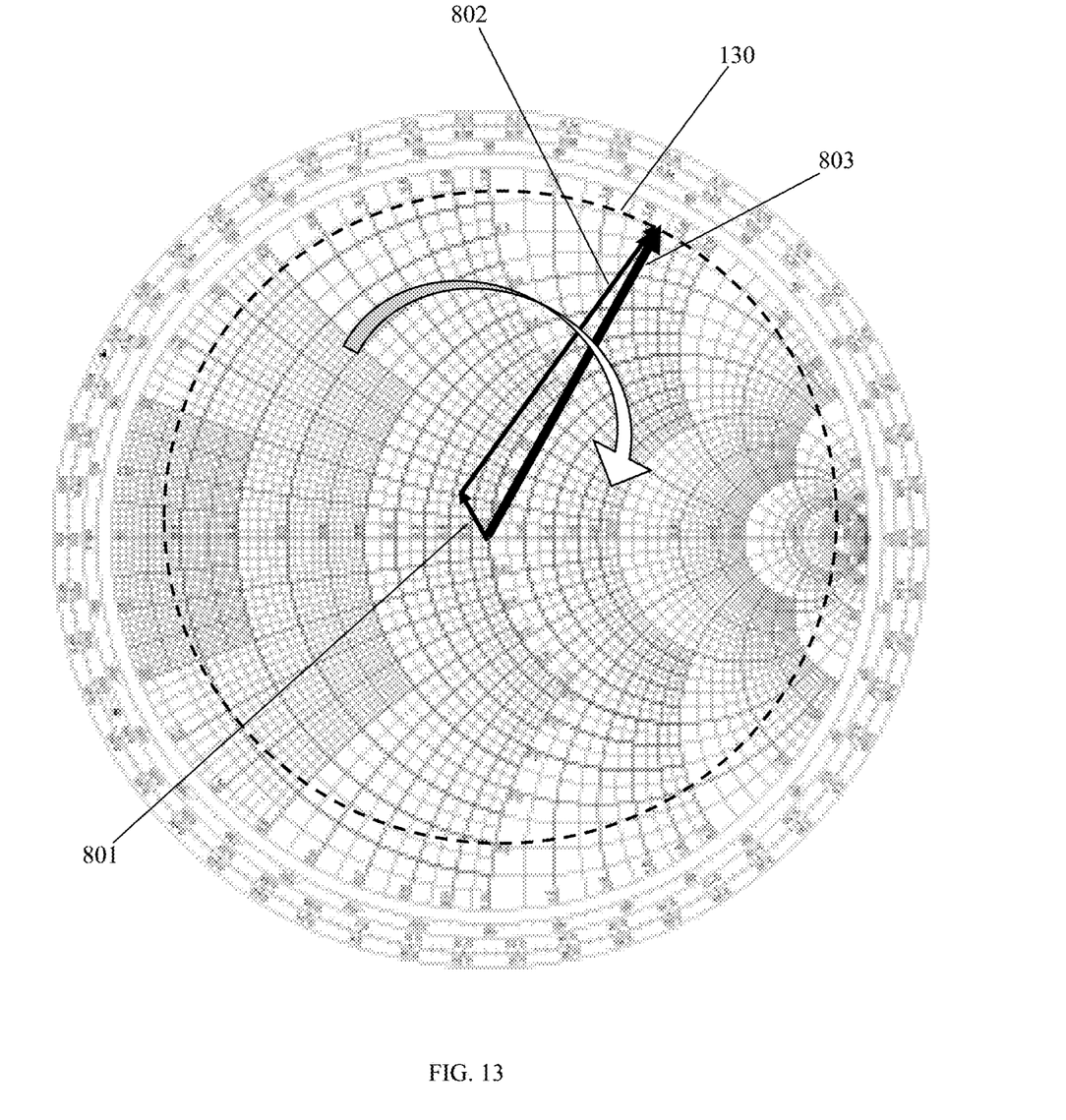
FIG. 13 depicts the individual reflection vectors that generate the overall reflection factor of the tuner, considering also the residual reflection of the RF energy absorbing device.

This invention discloses a radio frequency (RF, microwave), computer-controlled impedance tuning system, suitable for load pull measurements, comprising at least one electro-mechanical impedance tuner and the calibration method thereof. The tuner (FIGS. 3, 4 and 8) uses a low loss parallel plate transmission airline (slabline) 86, which includes a cylindrical center conductor 87. The center conductor terminates at the two ends of the airline, the test port 80 facing the DUT, and the idle port 804 facing the load. A metallic reflective tuning probe 89 slides along the slabline and is coupled capacitively with the center conductor. It can be moved only horizontally along the airline; the probe creates, at its own reference plane, a concentric reflection factor circle on the Smith chart (FIG. 12). The total reflection factor r, 803 presented by the tuner to the DUT at the test port 80 is created by the superposition of the two reflection factor vectors, the main reflection stemming from the metallic reflective tuning probe 802 attenuated by the RF energy absorbing device 82 and the residual reflection 801 of the RF energy absorbing device and can be seen in FIG. 13.

The horizontal control of the metallic reflective tuning probe in the airline 86 is best accomplished using stepper motor 85, and ACME gear 83 and of the RF energy-absorbing device using stepper motor 81. An electric actuator (see ref. 7) can also be used to control the tuning probe. Since the tuner does not have any adjustable vertical axis, i.e., the metallic reflective tuning probe remains inserted at all times and creates always a high reflection 802, seen at the test port as a circle 130, not being able to withdraw the tuning probe from the airline, eliminates the possibility of a wideband 50Ω neutral state. This neutral state is then created using the adjustable attenuation mechanism 82. In fact, from tuning range point of view the tuner of this invention does not behave differently than the prior art tuner of FIG. 2 for testing potentially unstable transistors. In both cases the allowable reflection factor range is limited in order to stay outside the instability circle of the DUT (see ref. 6), whether this happens by inserting the attenuator, or by partly withdrawing the metallic reflective tuning probe of the slide-screw tuner, to avoid crossing into the instability range of the transistor, is irrelevant. For maximum tuning range the attenuator of the tuner can be fully withdrawn.

Figure 4:
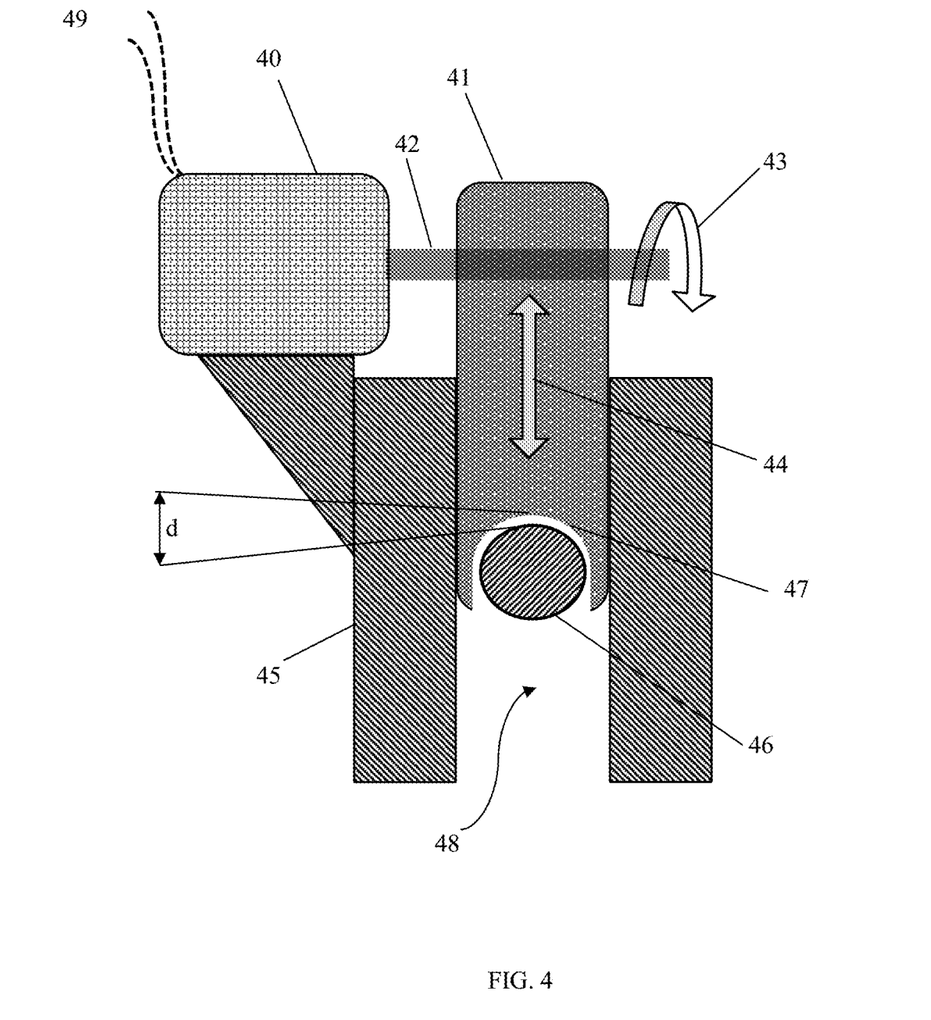
FIG. 4 depicts cross section of adjustable rotating RF energy-absorbing device and remote control.
Figure 5:
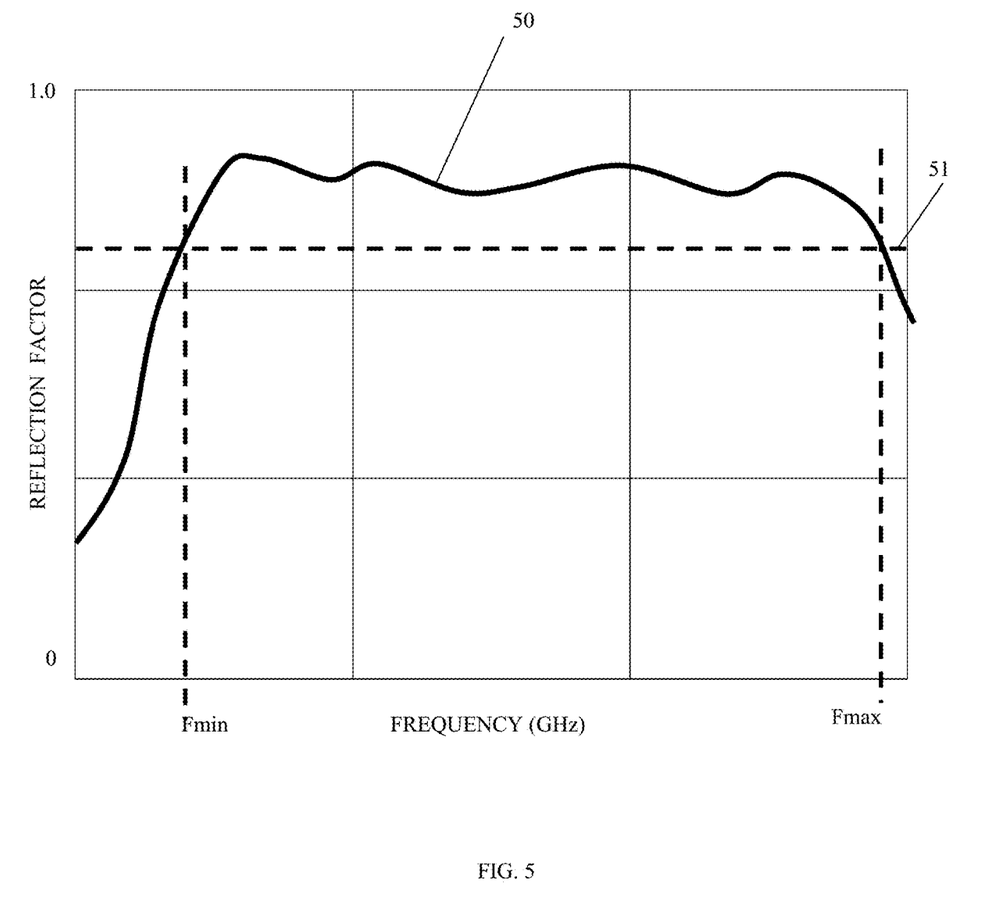
FIG. 5 depicts wideband reflection factor of fixed insertion tuning probe.
Figure 6:
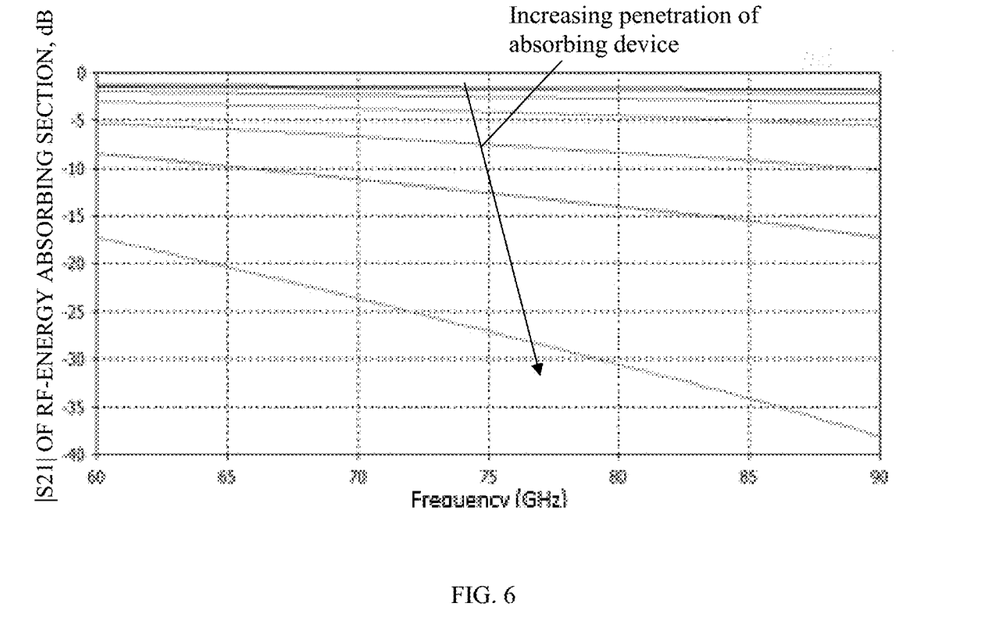
FIG. 6 depicts attenuation control of RF energy absorbing device.
Figure 7:
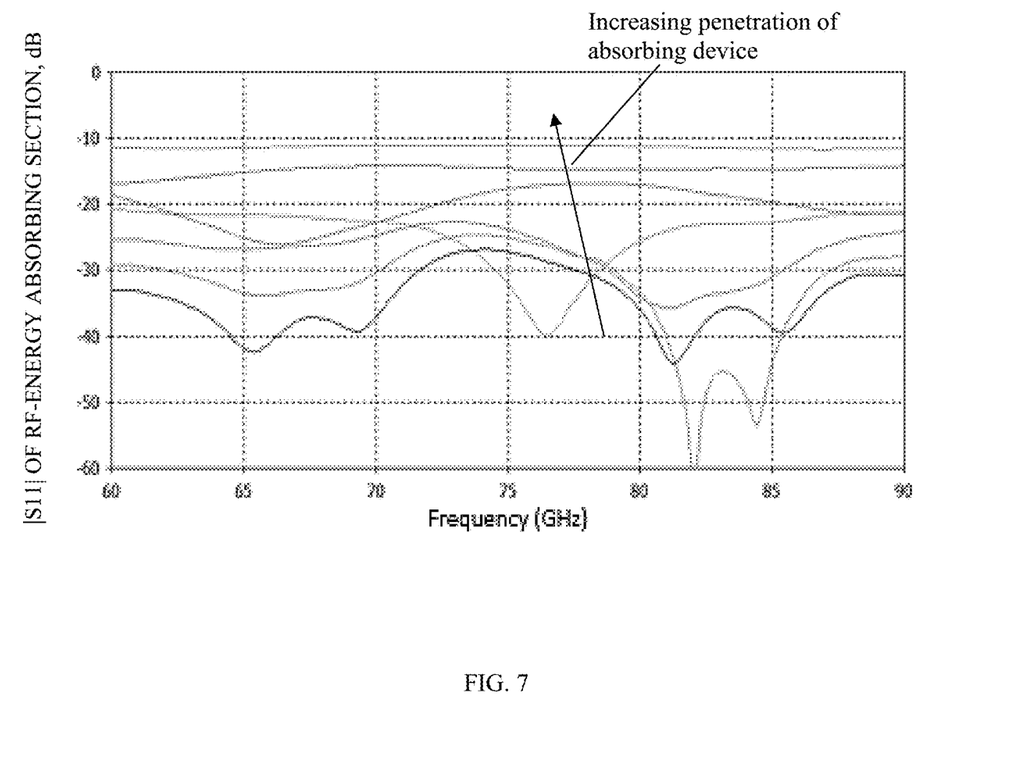
FIG. 7 depicts residual refection of RF energy absorbing device.
Figure 10:
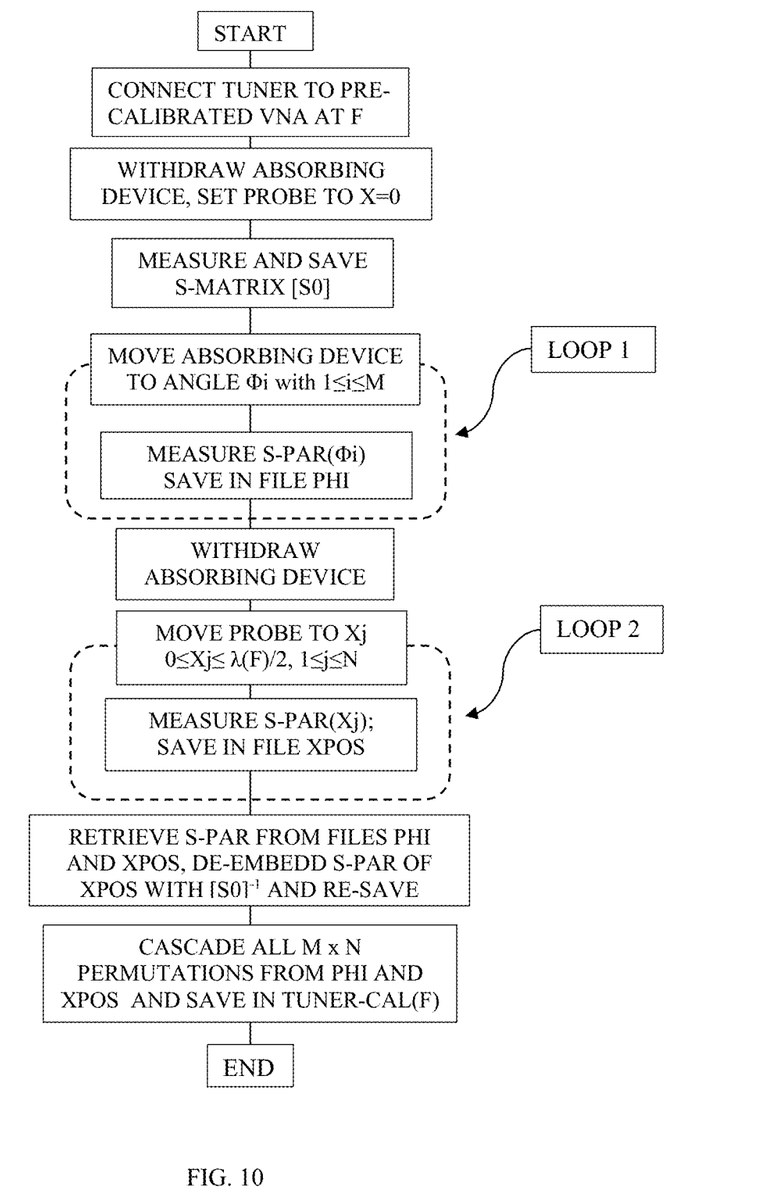
FIG. 10 depicts flowchart of the de-embedding calibration algorithm of the tuner using horizontally only moving tuning probe tuner with adjustable attenuator.

The RF energy absorbing device is shown in FIG. 4: it includes a disc 41 of RF energy-absorbing material, having a partly 805 or entirely concave periphery 47; the disc is rotated 43 eccentrically by the axis 42 of a remotely controlled 49 stepper motor 40, either directly or via a reducing gear for higher resolution. This eccentrical rotation causes a vertical 44 movement of the concave periphery 47 relative to the center conductor 46, which increasingly envelopes the center conductor 46 of the slabline 45 causing adjustable transfer attenuation (|S21|) (see FIG. 6). At the same time, though, the insertion of the RF energy absorbing disc 41 creates some undesired reflection (|S11|), seen as a function of frequency and penetration in FIG. 7, as symbol 801 in FIG. 8 and as residual vector 801 in FIG. 13, which cannot be compensated wideband and must be considered in the tuner calibration (FIG. 10).

Figure 8:
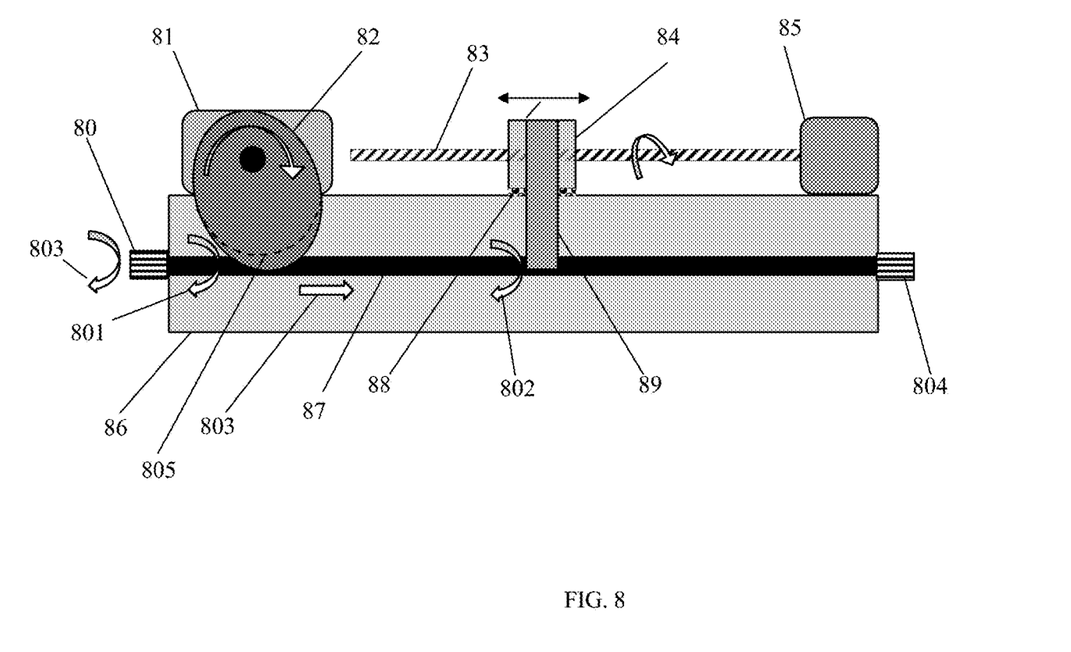
FIG. 8 depicts fixed penetration tuning probe tuner with adjustable attenuation section and control mechanism.

The detailed tuner structure is shown in FIG. 8: It includes a slabline 86, having a center conductor 87, a test port 80 with coaxial connector and an idle port 804 on the other end of the center conductor. On the top wall of the slabline there is a mobile carriage 84 sliding on a roller or glider 88. The mobile carriage holds a metallic reflective tuning probe 89, as shown as item 31 in FIG. 3. This reflective probe is inserted and fixed vertically close to the center conductor and moves only horizontally along the slabline. The carriage is controlled by the ACME screw 83 and the remotely controlled stepper motor 85. The movement resolution can be adjusted by changing the PITCH of the ACME. The metallic probe 89 creates a reflection 802, which has an approximately constant high magnitude 50 (FIG. 5) and adjustable phase, since the distance to the test port changes.

Between the test port 80 and the metallic reflective tuning probe 89, there is the RF energy absorbing device 82 in form of an eccentrically rotating disc (FIG. 4) with concave lip. This device rotates driven by remotely controlled stepper motor 81, absorbs part of the incoming RF energy and reflects a smaller portion 801 of the RF energy. The remaining RF energy 803 transfers to the metallic reflective tuning probe, where it is highly reflected 802. On its way back towards the test port the reflected RF energy 802 bounces back and forth between RF energy absorbing disc and reflecting tuning probe creating this way vanishing multiple reflections that can very difficultly be calculated. Therefore, the only practical way to handle the tuner behavior is to fully characterize (calibrate) the tuner twoport in a selected plurality of its possible states (attenuation values and tuning probe positions) and interpolate in-between.

The adjustable attenuator is shown in cross section in FIG. 4, 8: The RF energy-absorbing disc 82 is preferably made of ferromagnetic based commercially available material to capture the magnetic field around the center conductor 87, 46 and interrupt the wave propagation. The stepper motor 81, 40 rotates 43 eccentrically the absorbing disc, which is attached to its rotating axis 42 thus controlling 44 the distance d and the enveloping between the absorbing disc and the center conductor and this way the attenuation. The motor 40, 81 is firmly attached to the airline wall 45, 86 and does not move. The structure represents an efficient method for in situ attenuation control.

Figure 9:
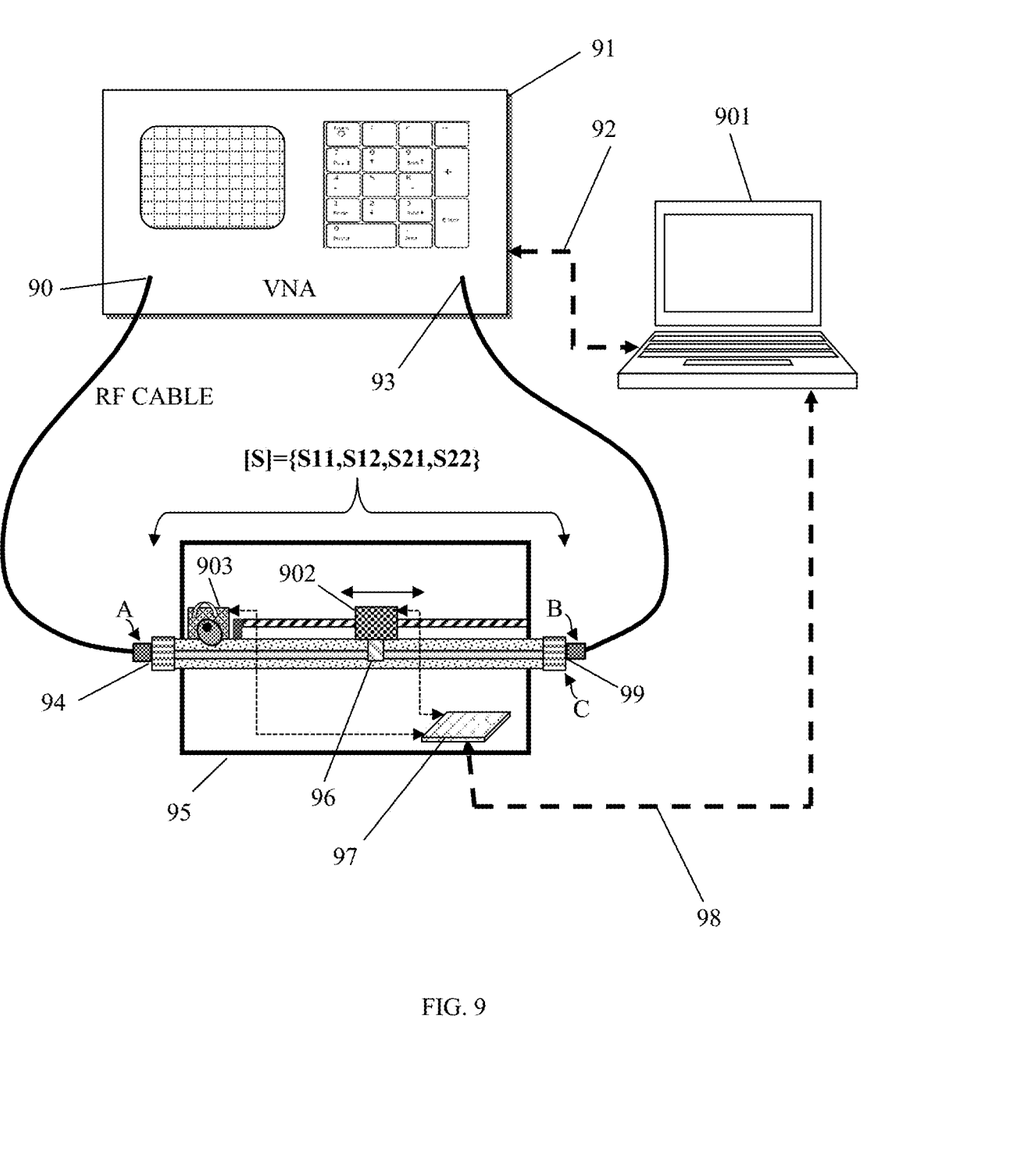
FIG. 9 depicts calibration setup of the tuner.

The calibration setup is shown in FIG. 9: the tuner 95 is connected between its test 94 and idle 99 ports to the ports 90 and 93 of the VNA 91 using high quality RF cables (see ref. 10). The tuner is controlled by the PC 901 via digital cable 98 sending commands to the electronic board 97 which controls the stepper motors 902 for the tuning probe 96 and 903 for the attenuation disc. The PC also communicates with the VNA for configuration and data transfer using digital cable 92. The VNA is triggered via cable 92 to measure scattering parameters Sij of the tuner for the positions X of the metallic reflective tuning probe 96 and the rotation angles Φ of the RF energy absorbing disc, set by the PC. In the end the data saved are s-parameters Sij (Φ, X).

Figures 11A, 11B:
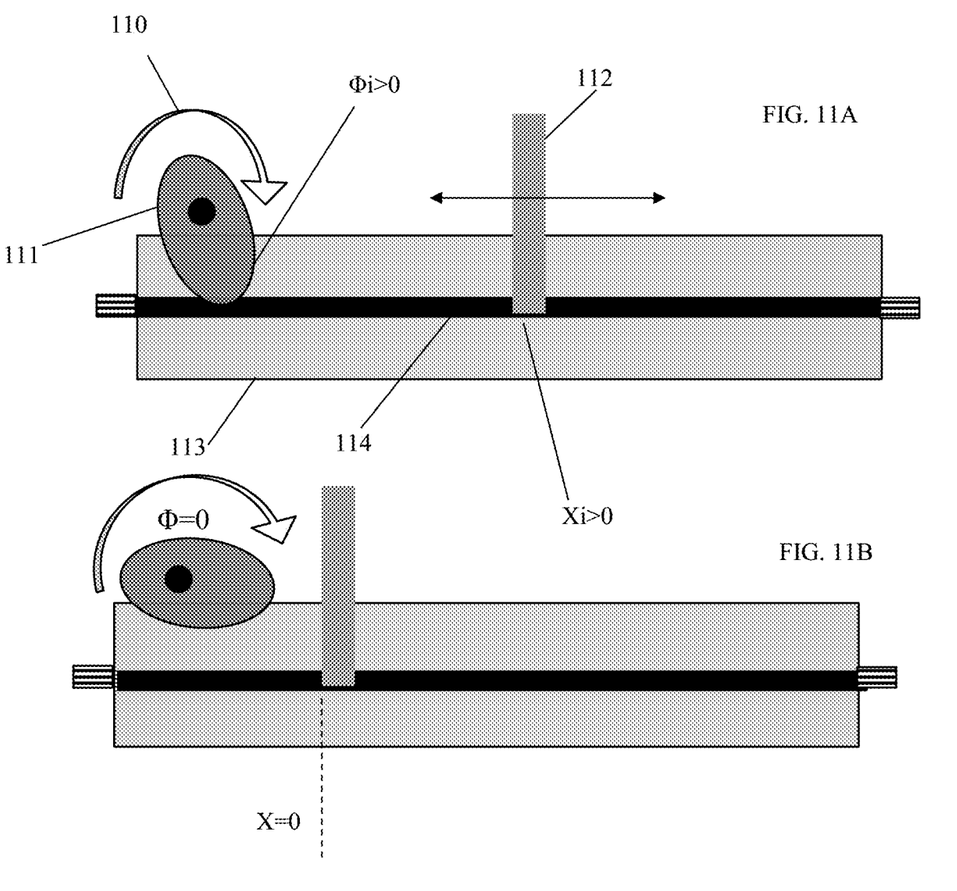
FIG. 11A depicts intermediate tuning state with average attenuation and arbitrary tuning phase.
FIG. 11B depicts initialization state (attenuator withdrawn and tuning probe at X=0).

The process of the tuner calibration is shown in the flowchart of FIG. 10: after calibrating the VNA at the terminations of the RF cables 94 and 99 and connecting the tuner 95 to them, in a first operation, the RF energy-absorbing device 82 is withdrawn from the slabline 86 defining an init angle Φ=0 and the metallic reflective tuning probe 89 is set to a position defined as X=0 close to the test port 80, as shown in FIG. 11B; in this situation s-parameters are measured at the VNA calibration frequency F and saved in an initialization matrix [S0]. Subsequently the RF energy-absorbing disc 82 is step rotated in a number M of settings Φi into the slabline between a state of full withdrawal (Φmin) and a state of maximum proximity to the center conductor (Φmax) and s-parameters are measured and saved in a format Sij(Φi, X=0), with 1≤i≤M, in a first file called PHI. In a next step the RF energy-absorbing disc is rotated back to the angle Φ=0 and the metallic reflective tuning probe 89 is moved along the slabline in a multitude N of steps Xj between 0≤Xj≤λ/2 and s-parameters are measured and saved in a file in the format Sij(Φ=0, Xj) with 0≤j≤N in a file called XPOS. Next the invers matrix $[S01]^{-1}$ is cascaded (see ref. 9) with the data retrieved from the file XPOS and re-saved de-embedded in the file XPOS. In a final step the data from files PHI and XPOS are retrieved, all M×N permutations of s-parameters are cascaded in computer memory and re-saved in a tuner calibration file TUN-CAL at the frequency F to be retrieved and allow reproduction of tuner s-parameters in an arbitrary setting and of the tuner as shown in FIG. 11B.

Figure 14:
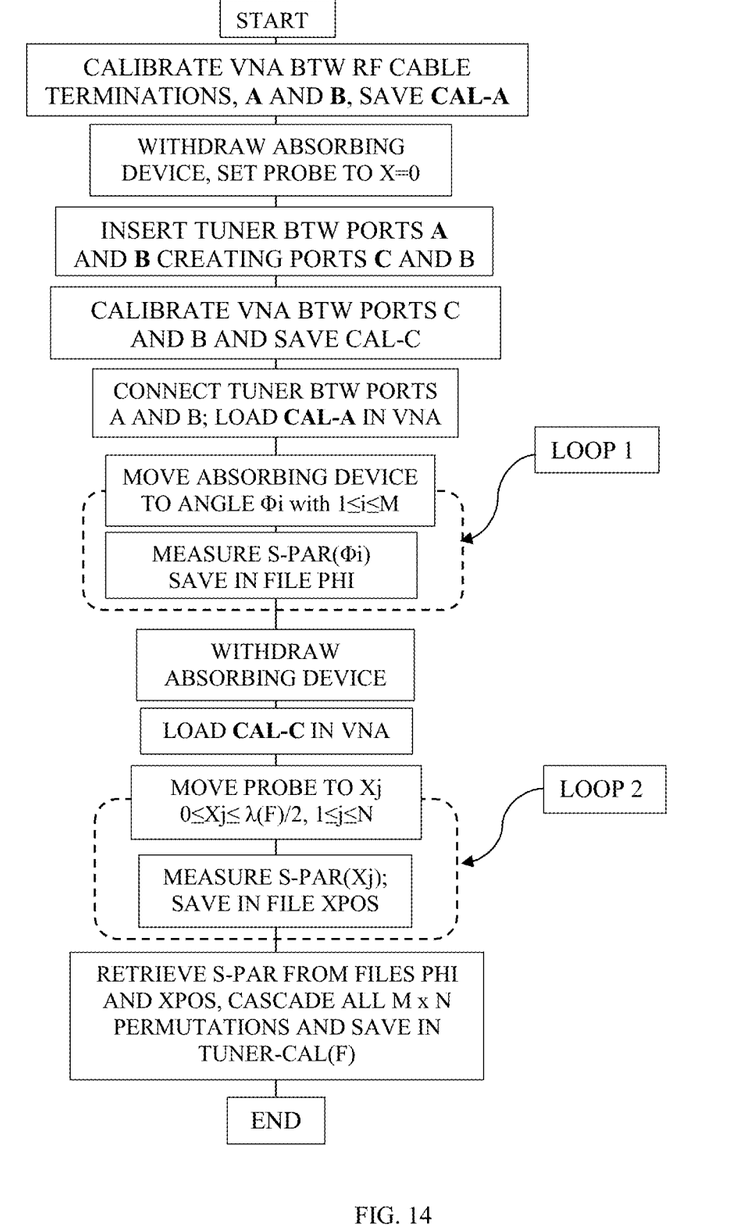
FIG. 14 depicts a flowchart of the alternative tuner calibration method using adapter removal instead of initialization matrix and de-embedding.

An alternative (adapter removal) process of the tuner calibration is shown in the flowchart of FIG. 14: after calibrating the VNA twice, a first time at the ends of the RF cables A and B (FIG. 9), saving the associated VNA error term calibration file as CAL-AB, and a second time whereby the initialized tuner (Φ=0, X=0) is connected to port 94 (port A) and the chain is split at port 99 creating a new set of ports, the initial port B and a new port C (the idle port of the tuner) and a new calibration between new port C and original port B is executed and saved as CAL-CB. Subsequently the attenuator setting/measuring/saving procedure (Φi), with X=0, uses CAL-AB error correction terms and the tuning probe movement (Xj) setting/measuring/saving procedure, with Φ=0, uses error correction terms CAL-CB; the init matrix [S0] and de-embedding steps are omitted. The s-parameters saved at the two measurement steps are directly cascaded in memory, instead, and saved in the tuner calibration file as before.

Obvious alternatives to the disclosed concept of a load pull system using a tuner with one horizontally only moving metallic reflective tuning probe and an adjustable in series and the associated calibration method shall not impede on to the validity of the present invention.

What is claimed is:

1. A load pull tuner system comprising:
   a coaxial load pull tuner comprising:
      a parallel plate transmission airline (slabline) having a longitudinal axis, a cavity parallel to the axis between two conductive sidewalls, a center conductor, a test and an idle port, and
      a remotely controlled mobile carriage travelling horizontally along the slabline and holding a reflective tuning probe, which is inserted into the cavity of the slabline at a fixed distance from the center conductor, and
      a RF energy-absorbing device, remotely insertable into the cavity of the slabline to an adjustable distance from the center conductor;
   wherein
      the RF energy-absorbing device is placed at a fixed position along the slabline between the test port and the reflective tuning probe;
   and
      a calibration method for the coaxial load pull tuner comprising:

connecting the tuner to a pre-calibrated vector network analyzer, measuring s-parameters of the tuner at a first multitude of penetrations of the RF energy-absorbing device into the cavity of the slabline and at a second multitude of positions of the reflective tuning probe along the slabline, and saving the said s-parameters in a calibration file.

2. The load pull tuner system of claim 1,
wherein the reflective tuning probe of the coaxial load pull tuner is movable at least one half of a wavelength along the slabline at a lowest frequency of operation of the coaxial load pull tuner, and the RF energy-absorbing device is placed at a position between the test port and the reflective tuning probe and is insertable into the cavity of the slabline.

3. The load pull tuner system of claim 1,
wherein the RF energy-absorbing device and the reflective tuning probe of the coaxial load pull tuner are cascaded inside the cavity of the slabline,
and wherein the RF energy-absorbing device is inserted into the cavity of the slabline between the test port and the reflective tuning probe.

4. The load pull tuner system of claim 1,
wherein the RF energy-absorbing device of the coaxial load pull tuner is a disc with concave periphery matching a cross section of the center conductor, said disc rotating eccentrically around an axis perpendicular to the axis of the slabline said rotation causing said disc to penetrate into the cavity of the slabline and approach to or withdraw from the center conductor between a state of full withdrawal and a state of close proximity to the center conductor.

5. The load pull tuner system of claim 1,
wherein the mobile carriage of the coaxial load pull tuner is remotely controlled by a first stepper motor and gear.

6. The load pull tuner system of claim 4,
wherein the axis controlling the RF energy-absorbing device of the coaxial load pull tuner is remotely controlled by a second stepper motor and gear.

7. The load pull tuner system as in claim 1,
wherein the calibration method for the coaxial load pull tuner comprises the following steps:
  a) connect the coaxial load pull tuner to a pre-calibrated vector network analyzer;
  b) rotate out (withdraw) the RF energy-absorbing device out of the cavity of the slabline, defining a rotation angle $\Phi o=0$;
  c) move the reflective tuning probe close to the test port, defining a horizontal position $Xo=0$;
  d) measure s-parameters of the coaxial load pull tuner and save in an init matrix [S0];
  e) in a first tuner control-s-parameter measurement loop
    rotate the RF energy-absorbing device to a multitude M of rotation angles $\Phi m$ between a value $\Phi min$, corresponding to withdrawal, and a value $\Phi max$ corresponding to closest proximity to the center conductor,
    measure s-parameters of the coaxial load pull tuner and save;
  f) rotate the RF energy-absorbing device back to the angle $\Phi o=0$;
  g) in a second tuner control-s-parameter measurement loop
    set the reflective tuning probe to a multitude N of horizontal positions Xn along the slabline, between positions Xo and $Xo+\lambda/2$,
    measure s-parameters of the coaxial load pull tuner and save;
  h) cascade the invers init matrix $[S0]^{-1}$ with the N s-parameters of step g) and save;
  i) cascade the M×N permutations of s-parameters of steps e) and h) and save in a tuner calibration file comprising M×N tuner s-parameters Sij ($\Phi m$, Xn) for $\{i,j\}=\{1,2\}$.

8. The load pull tuner system as in claim 1,
wherein the calibration method for the coaxial load pull tuner comprises the following steps:
  a) calibrate the VNA between terminations A and B of RF cables connected to associated ports of the VNA and save in VNA calibration file CAL-AB;
  b) insert the load pull tuner between the RF cable terminations A and B, wherein cable termination A connects with the test port of the tuner and cable termination B connects with the idle port of the tuner;
  c) rotate the RF energy-absorbing device out of the cavity of the slabline, (withdraw);
  d) move the reflective tuning probe close to the test port, defining a horizontal position Xo;
  e) break the connection between the idle port of the tuner and the RF cable termination B;
  f) calibrate the VNA between the idle port of the tuner and the RF cable termination B and save in VNA calibration file CAL-CB;
  g) reconnect the idle port of the tuner with the RF cable termination B;
  h) in a first tuner control-s-parameter measurement loop
    set the reflective tuning probe to a multitude N of horizontal positions Xn,
    between Xo and $Xo+\lambda/2$,
    measure s-parameters of the coaxial load pull tuner and save;
  i) return the reflective tuning probe to the horizontal position Xo;
  j) in a second tuner control-s-parameter measurement loop, load VNA calibration file CAL-AB into the VNA;
    rotate the RF energy-absorbing device to a multitude M of rotation angles $\Phi m$ between a value $\Phi min$, corresponding to withdrawal, and a value $\Phi max$ corresponding to closest proximity to the center conductor,
    measure s-parameters of the coaxial load pull tuner and save;
  k) cascade all M×N permutations of s-parameters saved in steps h) and j) and save in a tuner calibration file comprising M×N tuner s-parameters Sij ($\Phi m$, Xn) for $\{i,j\}=\{1,2\}$.

* * * * *